United States Patent
Sandy et al.

(10) Patent No.: US 7,152,126 B2
(45) Date of Patent: Dec. 19, 2006

(54) STACKED 3U PAYLOAD MODULE UNIT

(75) Inventors: Douglas L. Sandy, Chandler, AZ (US);
Jeffrey M. Harris, Chandler, AZ (US);
Robert C. Tufford, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 224 days.

(21) Appl. No.: 10/917,090

(22) Filed: Aug. 12, 2004

(65) Prior Publication Data

US 2006/0036793 A1    Feb. 16, 2006

(51) Int. Cl.
*G06F 13/40* (2006.01)
*H01R 12/16* (2006.01)
*G06F 13/42* (2006.01)

(52) U.S. Cl. .................... 710/301; 361/790

(58) Field of Classification Search ............... None
See application file for complete search history.

(56) References Cited

U.S. PATENT DOCUMENTS

| | | | | |
|---|---|---|---|---|
| 4,942,550 | A * | 7/1990 | Murray ............. | 710/301 |
| 5,575,686 | A * | 11/1996 | Noschese ............. | 439/620 |
| 5,648,891 | A * | 7/1997 | Gierut ............. | 361/788 |
| 5,768,106 | A * | 6/1998 | Ichimura ............. | 361/785 |
| 5,793,998 | A * | 8/1998 | Copeland et al. .......... | 710/305 |
| 6,122,161 | A * | 9/2000 | Gierut ............. | 361/683 |
| 6,324,071 | B1 * | 11/2001 | Weber et al. ............. | 361/785 |
| 6,362,974 | B1 * | 3/2002 | Lettang ............. | 361/790 |
| 6,392,891 | B1 * | 5/2002 | Tzlil et al. ............. | 361/719 |
| 6,418,034 | B1 * | 7/2002 | Weber et al. ............. | 361/790 |
| 6,477,593 | B1 * | 11/2002 | Khosrowpour et al. ...... | 710/100 |
| 6,738,260 | B1 * | 5/2004 | Sivertsen ............. | 361/740 |
| 6,768,642 | B1 * | 7/2004 | Hines et al. ............. | 361/721 |
| 6,977,819 | B1 * | 12/2005 | Bertram et al. ............. | 361/730 |
| 2003/0058600 | A1 * | 3/2003 | Bertram et al. ............. | 361/117 |
| 2003/0235042 | A1 * | 12/2003 | Harris et al. ............. | 361/752 |
| 2004/0078506 | A1 * | 4/2004 | Wong et al. ............. | 710/301 |
| 2004/0257763 | A1 * | 12/2004 | Andresen et al. .......... | 361/687 |

FOREIGN PATENT DOCUMENTS

EP    1376376 A2 *  1/2004

OTHER PUBLICATIONS

"Bus & Board 2004—Presentations Download Page"; Feb. 11, 2004; available online at www.busandboard.com.*

Wemekamp, John; "The VITA 46 Advanced Module Format"; Jan. 20, 2004; available online at www.busandboard.com.*

"Leading COTS Vendors Support Latest VME Specification for Mil-Aero"; Embedded Star; Jan. 20, 2004; available online at embeddedstar.com; all pages.*

The Institute of Electrical and Electronics Engineers; "IEEE Standard for a Common Mezzanine Card (CMC) Family"; The Institute of Electrical and Electronics Engineers; IEEE Std 1386-2001; Jun. 14, 2001; all pages.*

* cited by examiner

*Primary Examiner*—Rehana Perveen
*Assistant Examiner*—Ryan Stiglic
(74) *Attorney, Agent, or Firm*—Kevin D. Wills

(57) ABSTRACT

A stacked 3U payload module unit (207) includes a base module (220), where the base module has a 3U form factor (229), and where the base module is coupled to directly communicate with a switched fabric (106) on a backplane (104) of a computer chassis (112), where the backplane comprises the switched fabric and a VMEbus network (108) operating concurrently. Stacked 3U payload module unit (207) can also include a stacking module (222) coupled to the base module, wherein the stacking module has the 3U form factor, wherein the stacking module is communicatively coupled to the base module through a stacking switched fabric connector (209), and wherein the stacking module is communicatively coupled to the switched fabric via the base module and the stacking switched fabric connector.

25 Claims, 3 Drawing Sheets

STACKED 3U PAYLOAD MODULE UNIT

RELATED APPLICATIONS

Related subject matter is disclosed in U.S. patent application entitled "3U HOT-SWAPPABLE POWER MODULE AND METHOD" having application Ser. No. 10/917,091 and filed on the same date herewith and assigned to the same assignee.

BACKGROUND OF THE INVENTION

Expansion cards can be added to computer systems to lend additional functionality or augment capabilities. Current expansion cards interface and communicate with computer systems using primarily a multi-drop parallel bus network architecture, such as Peripheral Component Interconnect (PCI) or VERSAmodule Eurocard (VMEbus). A multi-drop parallel bus architecture has the disadvantage that it can only be used to support one instantaneous communication between modules in a computer system or network. However, some applications have requirements for simultaneous high bandwidth transfers between modules that cannot be handled by the multi-drop parallel bus architecture.

In the prior art, 6U form factor cards are common. The new 3U form factor offers an advantage for applications where physical space is at a premium. Prior art 3U form factor expansion cards interface with each other using multi-drop parallel networks. This has the disadvantage of being slow and cumbersome to network expansion.

Accordingly, there is a significant need for an apparatus and method that overcomes the deficiencies of the prior art outlined above.

BRIEF DESCRIPTION OF THE DRAWINGS

Referring to the drawing.

Figure 1:
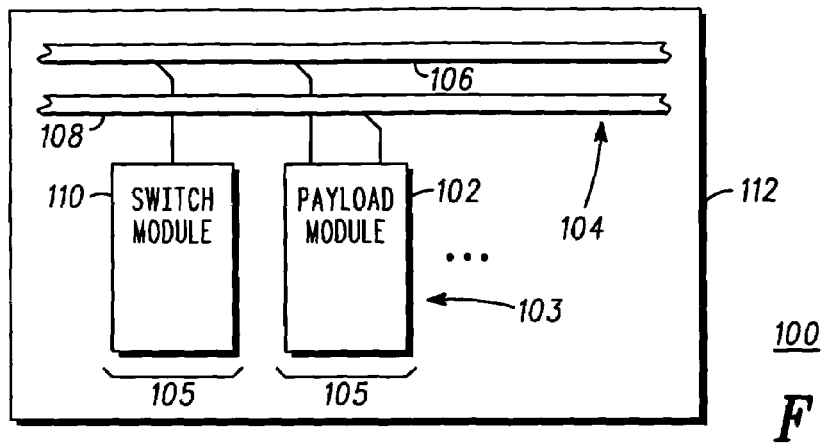
FIG. 1 depicts a multi-service platform system according to one embodiment of the invention.

It will be appreciated that for simplicity and clarity of illustration, elements shown in the drawing have not necessarily been drawn to scale. For example, the dimensions of some of the elements are exaggerated relative to each other. Further, where considered appropriate, reference numerals have been repeated among the Figures to indicate corresponding elements.

DESCRIPTION OF THE PREFERRED EMBODIMENTS

In the following detailed description of exemplary embodiments of the invention, reference is made to the accompanying drawings, which illustrate specific exemplary embodiments in which the invention may be practiced. These embodiments are described in sufficient detail to enable those skilled in the art to practice the invention, but other embodiments may be utilized and logical, mechanical, electrical and other changes may be made without departing from the scope of the present invention. The following detailed description is, therefore, not to be taken in a limiting sense, and the scope of the present invention is defined only by the appended claims.

In the following description, numerous specific details are set forth to provide a thorough understanding of the invention. However, it is understood that the invention may be practiced without these specific details. In other instances, well-known circuits, structures and techniques have not been shown in detail in order not to obscure the invention.

For clarity of explanation, the embodiments of the present invention are presented, in part, as comprising individual functional blocks. The functions represented by these blocks may be provided through the use of either shared or dedicated hardware, including, but not limited to, hardware capable of executing software. The present invention is not limited to implementation by any particular set of elements, and the description herein is merely representational of one embodiment.

FIG. 1 depicts a multi-service platform system 100 according to one embodiment of the invention. Multi-service platform system 100 can include computer chassis 112, with software and any number of slots 105 for inserting a 3U module 103, which can be, for example and without limitation, a payload module 102, a switch module 110, and the like. 3U modules 103 can add functionality to multi-service platform system 100 through the addition of processors, memory, storage devices, device interfaces, network interfaces, and the like. In one embodiment a backplane connector is used for connecting modules placed in the slots. In an embodiment, multi-service platform system 100 is an embedded, distributed processing computer system.

In an embodiment, 3U module 103 can refer to a module or expansion card that has a 3U form factor, which includes physical dimensions, electrical connections, and the like. As is known in the art, "U" and multiples of "U" refer to the width of a module or expansion card. In an embodiment, "U" can measure approximately 1.75 inches. Therefore, 3U module 103 can measure approximately 3U in width. 3U module 103 can have its own specific set of electrical connections to interface with backplane 104 of computer chassis 112. As an example of an embodiment, multi-service platform system 100 can include computer chassis 112 and one or more 3U modules conforming to the VITA 46 standard as set forth by VMEbus International Trade Association (VITA), P.O. Box 19658, Fountain Hills, Ariz., 85269. Multi-service platform system 100 includes a packet switched network, known as a switched fabric 106 and a VMEbus network 108, both located on backplane 104. In other words, a multi-service platform system 100 includes switched fabric 106 coincident with VMEbus network 108 on backplane 104.

In an embodiment, multi-service platform system 100 can be controlled by a platform controller (not shown for clarity), which can include a processor for processing algorithms stored in memory. Memory comprises control algorithms, and can include, but is not limited to, random access memory (RAM), read only memory (ROM), flash memory, electrically erasable programmable ROM (EEPROM), and the like. Memory can contain stored instructions, tables, data, and the like, to be utilized by processor. Platform controller can be contained in one, or distributed among two or more payload modules with communication among the various modules of multi-service platform system 100.

VMEbus network 108 is a parallel multi-drop bus network that is known in the art. VMEbus network 108 is defined in the ANSI/VITA 1-1994 and ANSI/VITA 1.1-1997 standards, promulgated by the VMEbus International Trade Association (VITA), P.O. Box 19658, Fountain Hills, Ariz., 85269 (where ANSI stands for American National Standards Institute). In an embodiment of the invention, VMEbus network 108 can include VMEbus based protocols such as Single Cycle Transfer protocol (SCT), Block Transfer protocol (BLT), Multiplexed Block Transfer protocol (MBLT), Two Edge VMEbus protocol (2eVME) and Two Edge Source Synchronous Transfer protocol (2eSST). VMEbus network 108 is not limited to the use of these VMEbus based protocols and other VMEbus based protocols are within the scope of the invention.

Switched fabric 106 can use switch module 110 as a central switching hub with any number of payload modules 102 coupled to switch module 110. Switched fabric 106 can be based on a point-to-point, switched input/output (I/O) fabric, whereby cascaded switch devices interconnect end node devices. Although FIG. 1 depicts switched fabric 106 as a bus for diagrammatic ease, switched fabric 106 may in fact be a star topology, mesh topology, and the like as known in the art for communicatively coupling switched fabrics. Switched fabric 106 can include both module-to-module (for example computer systems that support I/O module add-in slots) and chassis-to-chassis environments (for example interconnecting computers, external storage systems, external Local Area Network (LAN) and Wide Area Network (WAN) access devices in a data-center environment). Switched fabric 106 can be implemented by using one or more of a plurality of switched fabric network standards, for example and without limitation, InfiniBand™, Serial RapidIO™, FibreChannel™, Ethernet™, PCI Express™, Hypertransport™, and the like. Switched fabric 106 is not limited to the use of these switched fabric network standards and the use of any switched fabric network standard is within the scope of the invention.

In an embodiment of the invention, VMEbus network 108 and switched fabric 106 operate concurrently within multi-service platform system 100. In an example of an embodiment, VMEbus network 108 can operate as a control plane by synchronizing and organizing activities in multi-service platform system 100. Switched fabric 106 can operate as a data plane by transferring data between individual payload modules 102. In this embodiment, data is transferred faster through the higher bandwidth switched fabric 106, while the VMEbus network 108 controls and manages the overall system. This has the effect of increasing the speed of multi-service platform system 100 that is based on VMEbus specifications since data transfers that are in excess of VMEbus network 108 bandwidth can take place using switched fabric 106.

Multi-service platform system 100 can include any number of payload modules 102 and switch modules 110 coupled to backplane 104. Backplane 104 can include hardware and software necessary to implement a coincident VMEbus network 108 and a switched fabric 106.

Figure 2:
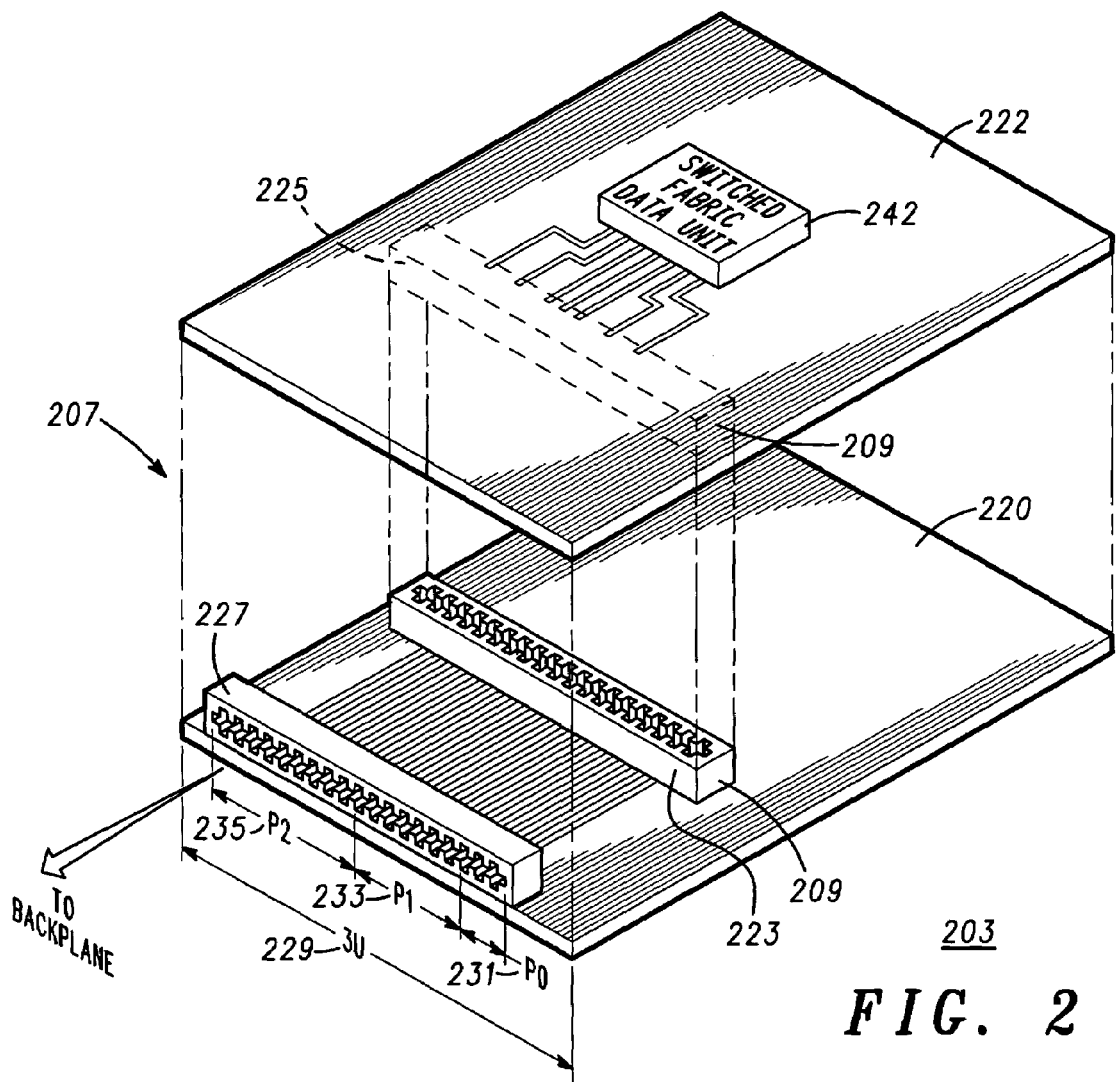
FIG. 2 depicts a 3U module according to an embodiment of the invention.

FIG. 2 depicts a 3U module 203 according to an embodiment of the invention. As shown in FIG. 2, 3U module 203 can include stacked 3U payload module unit 207. In an embodiment, stacked 3U payload module unit 207 can include base module 220 and stacking module 222. Both base module 220 and stacked module 222 have 3U form factor 229.

In an embodiment of the invention, backplane 104 and base module 220 have a set of interlocking connectors designed to interlock with each other when base module 220 is placed in a slot 105 of multi-service platform system 100. For example, base module 220 can have P0 mechanical envelope 231, P1 mechanical envelope 233 and P2 mechanical envelope 235 on base module 220, and corresponding mechanical envelopes J0, J1 and J2 (not shown for clarity) on backplane 104. Connectors in the P0/J0, P1/J1 and P2/J2 mechanical envelopes interlock when base module 220 is placed in a slot 105 of multi-service platform system 100. In the embodiment shown in FIG. 2, one switched fabric connector 227 is shown in the P0, P1 and P2 mechanical envelopes for clarity. This is not limiting of the invention as the P0, P1 and P2 mechanical envelopes can comprise any number of switched fabric connectors and be within the scope of the invention.

In an embodiment, switched fabric connector 227 in the P0 mechanical envelope 231, P1 mechanical envelope 233 and P2 mechanical envelope 235 can couple base module 220 to at least one of VMEbus network 108 or switched fabric 106. When base module 220 is placed in slot 105 of multi-service platform system 100 and coupled to backplane 104 via switched fabric connector 227, the functionality of base module 220 is added to multi-service platform system 100 through at least one of VMEbus network 108 or switched fabric 106.

In an example of an embodiment of the invention, switched fabric connector 227 can be a Tyco MultiGig RT connector manufactured by the AMP division of Tyco Electronics, Harrisburg, Pa. The invention is not limited to the use of the Tyco RT connector, and any connector capable of handling data using any of the plurality of switched fabric network standards is encompassed within the invention.

In an embodiment, stacking module 222 can be coupled to base module 220 and communicatively couple stacking module 222 with backplane 104 and switched fabric 106. Stacking module 222 can be coupled to base module 220 through stacking switched fabric connector 209. In effect, stacking module 222 is communicatively coupled to switched fabric 106 via base module 220 and stacking switched fabric connector 209. In another embodiment, stacking module 222 can also be communicatively coupled to VMEbus network 108 via base module 220 and stacking switched fabric connector 209.

In an embodiment, stacking switched fabric connector 209 is comprised of first portion 223 and second portion 225. First portion 223 of stacking switched fabric connector 209 is coupled to base module 220, and second portion 225 of stacking switched fabric connector 209 is coupled to stacking module 222. First portion 223 and second portion 225 are designed to interlock when stacking module 222 is coupled to base module 220. Once coupled, stacking module 222 can communicate on switched fabric 106 through base module 220 and stacking switched fabric connector 209.

In an embodiment, stacking module 222 can have at least one switched fabric data unit 242 coupled to second portion 225 of stacking switched fabric connector 209. Switched fabric data unit 242 can be a processor, storage device, memory, and the like, coupled to communicate with switched fabric 106.

In an example of an embodiment of the invention, stacking switched fabric connector 209 can be a Tyco MultiGig RT connector manufactured by the AMP division of Tyco Electronics, Harrisburg, Pa. The invention is not limited to the use of the Tyco RT connector, and any connector capable of handling data using any of the plurality of switched fabric network standards is encompassed within the invention.

In an embodiment, base module 220 manages and controls stacking module 222 such that stacking module 222 does not operate independently of base module 220 on switched fabric 106. In another embodiment, stacking module 222 is coupled directly to backplane 104 and hence switched fabric 106 through base module 220 and stacking switched fabric connector 209. Directly communicate can mean that although stacking module 222 is coupled to base module 220, base module 220 does not control or manage stacking module 222. In this embodiment, base module 220 acts as a carrier module for stacking module 222, with base module 220 acting merely as a connection point for stacking module 222 to physically interface with switched fabric 106. In this embodiment, base module 220 does not have to appear as an active node on switched fabric 106. However, in another embodiment, base module 220 can appear as an active node on either or both of VMEbus network 108 and switched fabric 106.

In an embodiment, since stacking module 222 is coupled directly to switched fabric 106 and backplane 104 though base module 220, stacking module 222 is coupled to directly communicate with switch module 110. Hence, in this embodiment, switch module 110 can directly control stacking module 222. In effect, stacking module 222 is an independent node on switched fabric 106 that can operate on switched fabric 106 without guidance, management or interference from base module 220.

In another embodiment, base module 220 and stacking module 222 are directly coupled such that they can communicate with each other without having to use the backplane 104. In other words, base module 220 and stacking module 222 can communicate independently without using switched fabric 106 or VMEbus network 108 on backplane 104.

In an embodiment, stacking 3U payload module 207 can include stacking module 222 that only interfaces with switched fabric 106. In another embodiment, stacking 3U payload module 207 can include stacking module 222 that interfaces and communicates with both switched fabric 106 and VMEbus network 108.

Although FIG. 2 depicts only one stacking module 222, any number of stacking modules are encompassed by the invention. For example, any number of stacking modules can be coupled to base module 220, or any number of stacking modules can be stacked upon one another and be within the scope of the invention.

Figure 3:
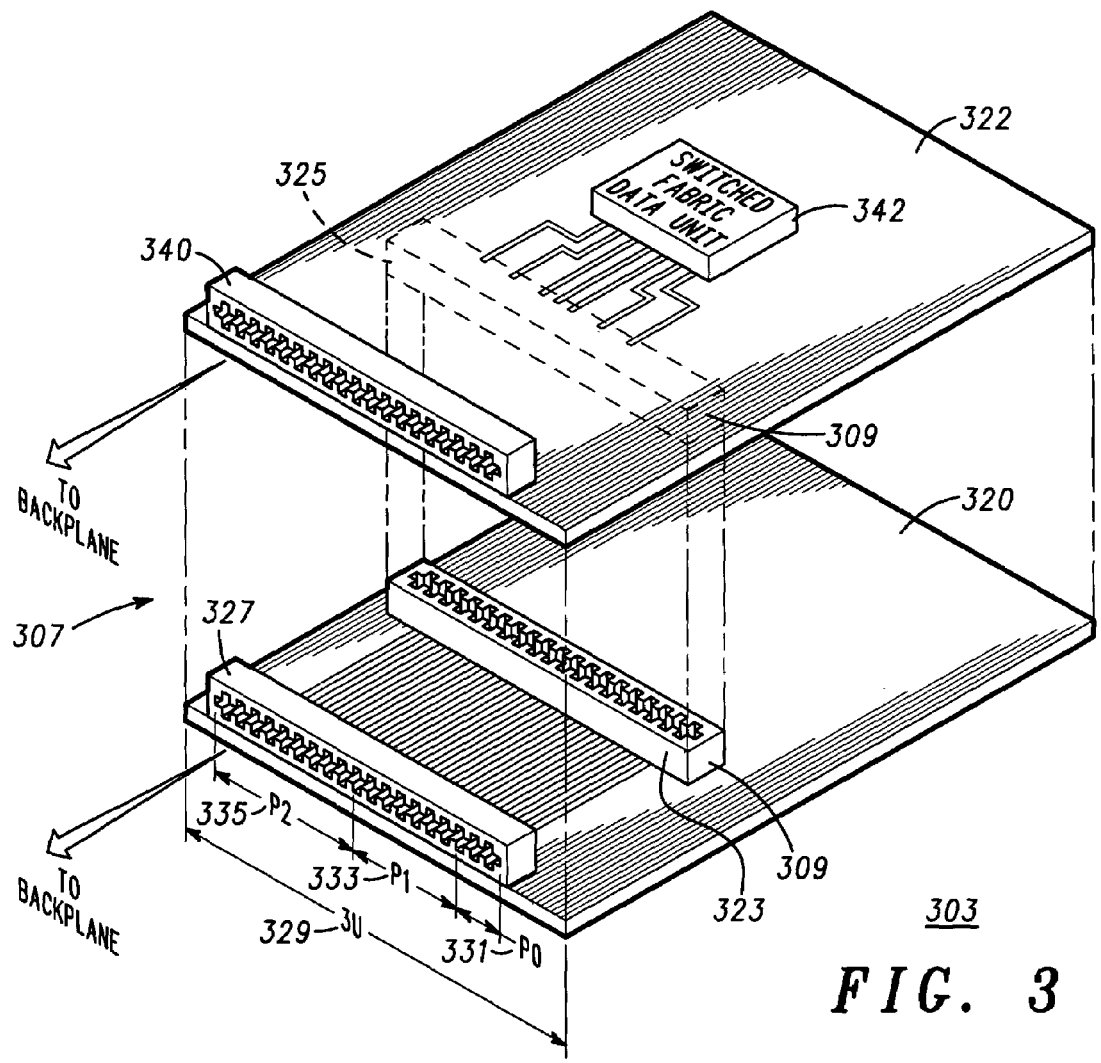
FIG. 3 depicts a 3U module according to another embodiment of the invention.

FIG. 3 depicts a 3U module 303 according to another embodiment of the invention. As shown in FIG. 3, 3U module 303 can include stacked 3U payload module unit 307. In an embodiment, stacked 3U payload module unit 307 can include base module 320 and stacking module 322. Both base module 320 and stacked module 322 have 3U form factor 329.

In an embodiment of the invention, backplane 104 and base module 320 have a set of interlocking connectors designed to interlock with each other when base module 320 is placed in a slot 105 of multi-service platform system 100. For example, base module 320 can have P0 mechanical envelope 331, P1 mechanical envelope 333 and P2 mechanical envelope 335 on base module 320, and corresponding mechanical envelopes J0, J1 and J2 (not shown for clarity) on backplane 104. Connectors in the P0/J0, P1/J1 and P2/J2 mechanical envelopes interlock when base module 320 is placed in a slot 105 of multi-service platform system 100. In the embodiment shown in FIG. 2, one switched fabric connector 327 is shown in the P0, P1 and P2 mechanical envelopes for clarity. This is not limiting of the invention as the P0, P1 and P2 mechanical envelopes can comprise any number of switched fabric connectors and be within the scope of the invention.

In an embodiment, switched fabric connector 327 in the P0 mechanical envelope 331, P1 mechanical envelope 333 and P2 mechanical envelope 335 can couple base module 320 to at least one of VMEbus network 108 or switched fabric 106. When base module 320 is placed in slot 105 of multi-service platform system 100 and coupled to backplane 104 via switched fabric connector 327, the functionality of base module 320 is added to multi-service platform system 100 through at least one of VMEbus network 108 or switched fabric 106.

In an example of an embodiment of the invention, switched fabric connector 327 can be a Tyco MultiGig RT connector manufactured by the AMP division of Tyco Electronics, Harrisburg, Pa. The invention is not limited to the use of the Tyco RT connector, and any connector capable of handling data using any of the plurality of switched fabric network standards is encompassed within the invention.

In an embodiment, stacking module 322 can be coupled to base module 320 and communicatively couple stacking module 322 with backplane 104 and switched fabric 106. Stacking module 322 can be coupled to base module 320 through stacking switched fabric connector 309. In effect, stacking module 322 is communicatively coupled to switched fabric 106 via base module 320 and stacking switched fabric connector 309. In another embodiment, stacking module 322 can also be communicatively coupled to VMEbus network 108 via base module 320 and stacking switched fabric connector 309.

In an embodiment, stacking switched fabric connector 309 is comprised of first portion 323 and second portion 325. First portion 323 of stacking switched fabric connector 309 is coupled to base module 320, and second portion 325 of stacking switched fabric connector 309 is coupled to stacking module 322. First portion 323 and second portion 325 are designed to interlock when stacking module 322 is coupled to base module 320. Once coupled, stacking module 322 can communicate on switched fabric 106 through base module 320 and stacking switched fabric connector 309.

In an embodiment, stacking module 322 can have at least one switched fabric data unit 342 coupled to second portion 325 of stacking switched fabric connector 309. Switched fabric data unit 342 can be a processor, storage device, memory, and the like, coupled to communicate with switched fabric 106.

In an example of an embodiment of the invention, stacking switched fabric connector 309 can be a Tyco MultiGig RT connector manufactured by the AMP division of Tyco Electronics, Harrisburg, Pa. The invention is not limited to the use of the Tyco RT connector, and any connector capable of handling data using any of the plurality of switched fabric network standards is encompassed within the invention.

In another embodiment, stacking module 322 is coupled directly to backplane 104 and hence switched fabric 106 through base module 320 and stacking switched fabric connector 309. In another embodiment, stacking module 322 is coupled directly to backplane 104 through stacking module connector 340, which can be analogous to switched fabric connector 327 on base module 320.

Directly communicate can mean that although stacking module 322 is coupled to base module 320, base module 320 does not control or manage stacking module 322. In this embodiment, base module 320 acts as a carrier module for stacking module 322, with base module 320 acting merely as one connection point for stacking module 322 to physically interface with switched fabric 106. In this embodiment, base module 320 does not have to appear as an active node on switched fabric 106. However, in another embodiment, base module 320 can appear as an active node on either or both of VMEbus network 108 and switched fabric 106.

In an embodiment, since stacking module 322 can be coupled directly to switched fabric 106 and backplane 104 though base module 320, stacking module 322 is coupled to directly communicate with switch module 110. Hence, in this embodiment, switch module 110 can directly control stacking module 322. In effect, stacking module 322 is an independent node on switched fabric 106 that can operate on switched fabric 106 without guidance, management or interference from base module 320.

In another embodiment, base module 320 and stacking module 322 are directly coupled such that they can communicate with each other without having to use the backplane 104. In other words, base module 320 and stacking module 322 can communicate independently without using switched fabric 106 or VMEbus network 108 on backplane 104.

In an embodiment, stacking 3U payload module 307 can include stacking module 322 that only interfaces with switched fabric 106. In another embodiment, stacking 3U payload module 307 can include stacking module 322 that interfaces and communicates with both switched fabric 106 and VMEbus network 108.

Although FIG. 3 depicts only one stacking module 322, any number of stacking modules are encompassed by the invention. For example, any number of stacking modules can be coupled to base module 320, or any number of stacking modules can be stacked upon one another and be within the scope of the invention.

Figure 4:
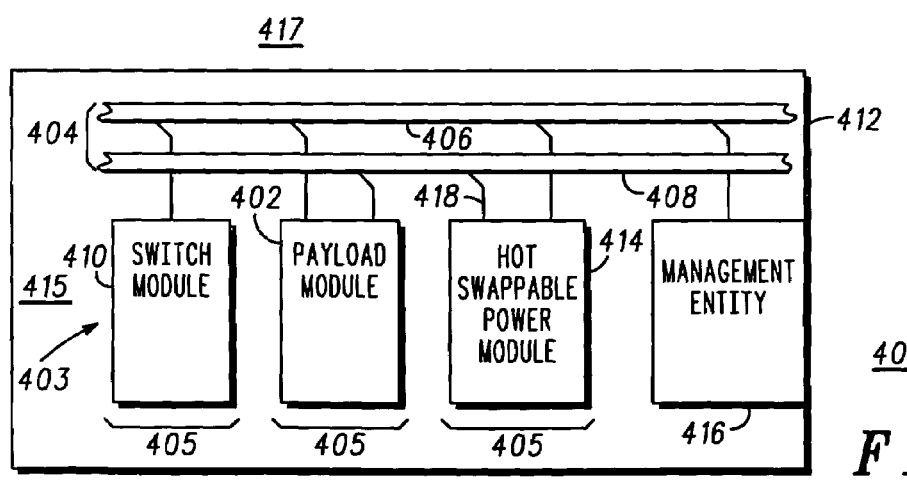
FIG. 4 depicts a multi-service platform system according to another embodiment of the invention.

FIG. 4 depicts a multi-service platform system 400 according to another embodiment of the invention. Multi-service platform system 400 can include computer chassis 412, with software and any number of slots 405 for inserting a 3U module 403, which can be, for example and without limitation, a payload module 402, a switch module 410, hot-swappable power module 414, and the like. 3U module 403 can add functionality to multi-service platform system 400 through the addition of processors, memory, storage devices, device interfaces, network interfaces, power supplies, and the like. In one embodiment a backplane connector is used for connecting modules placed in the slots. In an embodiment, multi-service platform system 400 is an embedded, distributed processing computer system.

As an example of an embodiment, multi-service platform system 400 can include computer chassis 412 and one or more 3U modules conforming to the VITA 46 standard as set forth by VMEbus International Trade Association (VITA), P.O. Box 19658, Fountain Hills, Ariz., 85269. Multi-service platform system 400 includes a packet switched network, known as a switched fabric 406 and a VMEbus network 408, both located on backplane 404. In other words, a multi-service platform system 400 includes switched fabric 406 coincident with VMEbus network 408 on backplane 404. Both VMEbus network 408 and switched fabric 406 are analogous to those discussed with reference to FIG. 1.

Multi-service platform system 400 can include any number of payload modules 402, switch modules 410, or hot-swappable power modules 414 coupled to backplane 404. Backplane 404 can include hardware and software necessary to implement a coincident VMEbus network 408 and a switched fabric 406.

Hot-swappable power module 414 can supply power to computer chassis 412 through power connection 418. Power can be supplied to other 3U modules 403 in computer chassis 412 through backplane 404. In an embodiment, hot-swappable power module 414 can be one of several power supplies to computer chassis 412. Also, in an embodiment, hot-swappable power module 414 can be actively managed through switched fabric 406. Actively managed can include monitoring and controlling the status of hot-swappable power module 414. For example, hot-swappable power module 414 can be actively managed by monitoring its status, detecting a problem, and shutting down hot-swappable power module 414 after switching over to an alternate power supply. Actively managed can also include notifying a system administrator of the status of hot-swappable power module 414.

In an embodiment where there are multiple power supplies coupled to computer chassis 412, coupling or decoupling hot-swappable power module 414 to/from computer chassis 412 will fail to disrupt power to computer chassis 412. In other words, hot-swappable power module 414 can be inserted and removed from computer chassis 412 while computer chassis 412 is in operation without disrupting power to 3U modules 403 or computer chassis 412.

In an embodiment, multi-service platform system 400 can have management entity 416 coupled to manage 3U modules 403 in computer chassis 412. For example, management entity 416 can track and manage which slots 405 in computer chassis 412 are occupied, the capabilities of each 3U module 403, the power supply source for computer chassis, and the like, through the use of any combination of hardware and software. In an embodiment, management entity 416 can be within 415 computer chassis 412. In this embodiment, management entity 416 can be embedded in computer chassis 412 or located on a 3U module 403 in computer chassis 412. In another embodiment, management entity 416 can be located outside 417 of computer chassis 412 (not shown for clarity).

In an embodiment, management entity 416 is coupled to switched fabric 406 to actively manage 3U modules 403. In another embodiment, management entity 416 can be coupled to VMEbus network 408 and switched fabric 406 to manage 3U modules 403. In either embodiment, management entity 416 is coupled to 3U modules 403 through backplane 404.

Figure 5:
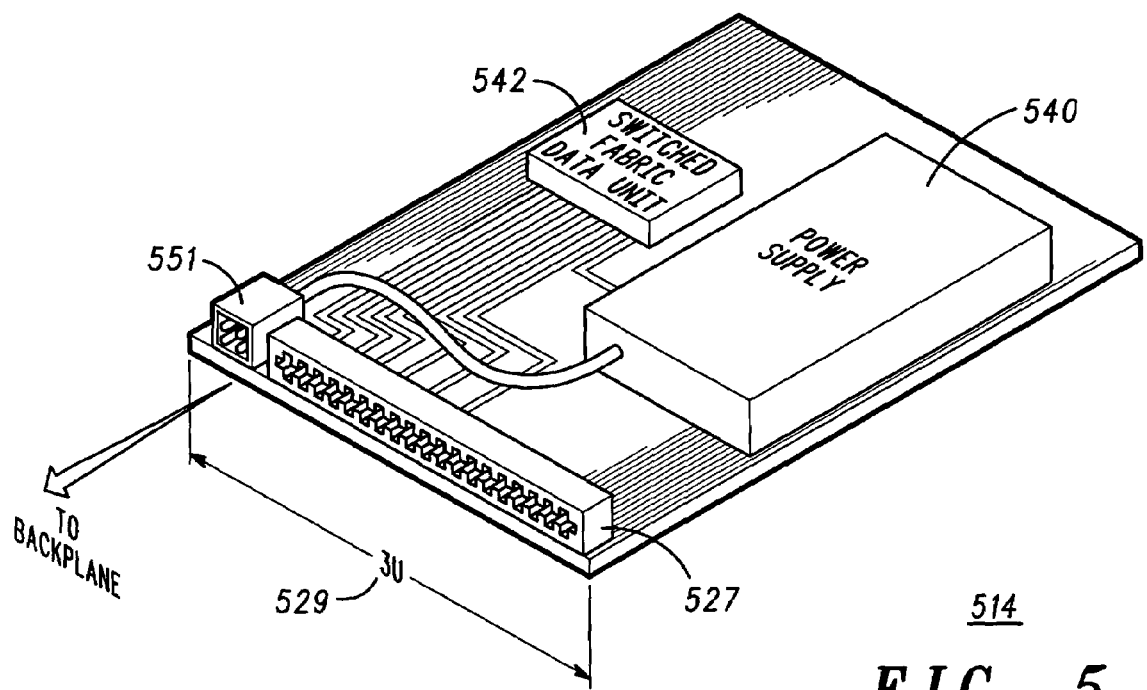
FIG. 5 depicts a hot-swappable power module according to an embodiment of the invention.

FIG. 5 depicts a hot-swappable power module 514 according to an embodiment of the invention. As shown in FIG. 5, hot-swappable power module 514 has a 3U form factor 529 and can include power supply 540, switched fabric data unit 542, switched fabric connector 527 and power connector 551.

In an embodiment, power supply 540 can be any type of power supply, for example, AC or DC, to supply power to computer chassis 412. Power supply 540 can be coupled to power connector 551, which can have a corresponding power connector on backplane 404. Power connector 551 is designed to interlock with corresponding power connector on backplane 404 when hot-swappable power module 514 is inserted into slot 405 of computer chassis 412. Power supply 540 supply can supply power to computer chassis 412 via backplane 404 through power connector 551.

In an embodiment of the invention, backplane 404 and hot-swappable power module 514 have a set of interlocking connector(s) designed to interlock with each other when hot-swappable power module 514 is placed in a slot 105 of multi-service platform system 400. For example, hot-swappable power module 514 can have P0, P1 and P2 mechanical envelopes analogous to those shown in FIG.'s 2 and 3. In an embodiment, hot-swappable power module 514 has switched fabric connector 527 designed to interlock with a corresponding switched fabric connector on backplane 404. In the embodiment shown in FIG. 5, one switched fabric connector 527 is shown for clarity. This is not limiting of the invention as hot-swappable power module 514 can comprise any number of switched fabric connectors and be within the scope of the invention.

In an embodiment, switched fabric connector 527 can couple hot-swappable power module 514 to switched fabric 406. When hot-swappable power module 514 is placed in slot 405 of multi-service platform system 400 and coupled to backplane 404 via switched fabric connector 527, hot-swappable power module 514 can supply multi-service platform system 400 with power. Also, hot-swappable power module 514 can be actively managed via switched fabric 406.

In an example of an embodiment of the invention, switched fabric connector 527 can be a Tyco MultiGig RT connector manufactured by the AMP division of Tyco Electronics, Harrisburg, Pa. The invention is not limited to the use of the Tyco RT connector, and any connector capable of handling data using any of the plurality of switched fabric network standards is encompassed within the invention.

In an embodiment, hot-swappable power module 514 can have at least one switched fabric data unit 542. Switched fabric data unit 542 can be a processor, storage device, memory, and the like, coupled to communicate with switched fabric 406. In an embodiment, switched fabric data unit 542 is coupled to manage power supply 540. Managing power supply 540 can include monitoring power supply 540, transmitting data regarding power supply 540 over switched fabric 406 to management entity 416, controlling power supply 540 by engaging and disengaging from computer chassis 412 as dictated by management entity 416 via switched fabric 406, and the like. In another embodiment, management entity 416 can be incorporated into switched fabric data unit 542, where power supply 540 can then be actively managed locally from switched fabric data unit 542.

While we have shown and described specific embodiments of the present invention, further modifications and improvements will occur to those skilled in the art. It is therefore, to be understood that appended claims are intended to cover all such modifications and changes as fall within the true spirit and scope of the invention.

The invention claimed is:

1. A multi-service platform system, comprising:
   a computer chassis coupled to accept at least one payload module having a 3u form factor;
   a backplane integrated with the computer chassis;
   a VMEbus network on the backplane;
   a switched fabric operating coincident with the VMEbus network on the backplane;
   a base module coupled to the backplane, wherein the base module has the 3U form factor, and wherein the base module is coupled to directly communicate with the switched fabric on the backplane; and
   a stacking module coupled to the base module, wherein the stacking module has the 3U form factor, wherein the stacking module is communicatively coupled to the base module through a stacking switched fabric connector, and wherein the stacking module is communicatively coupled to the switched fabric via the base module and the stacking switched fabric connector.

2. The multi-service platform system of claim 1, wherein the stacking module is coupled to directly communicate with the switched fabric via the backplane.

3. The multi-service platform system of claim 1, wherein the base module is coupled to directly communicate with the VMEbus network.

4. The multi-service platform system of claim 1, wherein the stacking module is coupled to communicate with the VMEbus network through the stacking switched fabric connector.

5. The multi-service platform system of claim 1, wherein the stacking module is coupled to communicate directly with the VMEbus network.

6. The multi-service platform system of claim 1, wherein the base module and the stacking module are coupled to communicate with each other independent of the backplane.

7. A computer chassis coupled to accept at least one payload module having a 3U form factor, the computer chassis comprising:
   a backplane integrated with the computer chassis;
      a VMEbus network on the backplane;
      a switched fabric operating coincident with the VMEbus network on the backplane;
      a base module coupled to the backplane, wherein the base module has the 3U form factor, and wherein the base module is coupled to directly communicate with the switched fabric on the backplane; and
      a stacking module coupled to the base module, wherein the stacking module has the 3U form factor, wherein the stacking module is communicatively coupled to the base module through a stacking switched fabric connector, and wherein the stacking module is communicatively coupled to the switched fabric via the base module and the stacking switched fabric connector.

8. The computer chassis of claim 7, wherein the stacking module is coupled to directly communicate with the switched fabric via the backplane.

9. The computer chassis of claim 7, wherein the base module is coupled to directly communicate with the VMEbus network.

10. The computer chassis of claim 7, wherein the stacking module is coupled to communicate with the VMEbus network through the stacking switched fabric connector.

11. The computer chassis of claim 7, wherein the stacking module is coupled to communicate directly with the VMEbus network.

12. The computer chassis of claim 7, wherein the base module and the stacking module are coupled to communicate with each other independent of the backplane.

13. A stacked 3U payload module unit, comprising:
   a base module, wherein the base module has a 3U form factor, and wherein the base module is coupled to directly communicate with a switched fabric on a backplane of a computer chassis, wherein the backplane comprises the switched fabric and a VMEbus network operating concurrently; and
   a stacking module coupled to the base module, wherein the stacking module has the 3U form factor, wherein the stacking module is communicatively coupled to the base module through a stacking switched fabric connector, and wherein the stacking module is communicatively coupled to the switched fabric via the base module and the stacking switched fabric connector.

14. The stacked 3U payload module unit of claim 13, wherein the stacking module is coupled to directly communicate with the switched fabric via the backplane.

15. The stacked 3U payload module unit of claim 13, wherein the base module is coupled to directly communicate with the VMEbus network.

16. The stacked 3U payload module unit of claim 13, wherein the stacking module is coupled to communicate with the VMEbus network through the stacking switched fabric connector.

17. The stacked 3U payload module unit of claim 13, wherein the stacking module is coupled to communicate directly with the VMEbus network.

18. The stacked 3U payload module of claim 13, wherein the base module and the stacking module are coupled to communicate with each other independent of the backplane.

19. A base module, comprising:

a switched fabric connector coupled to interface with a switched fabric operating on backplane of a computer chassis, wherein the switched fabric operates concurrently on a backplane with a VMEbus network, and wherein the base module has a 3U form factor; and a first portion of a stacking switched fabric connector coupled to interface with a second portion of the stacking switched fabric connector on a stacking module, wherein the stacking module is communicatively coupled to the switched fabric via the base module and the first portion of the stacking switched fabric connector, and wherein the stacking module has the 3U form factor.

20. The base module of claim 19, wherein the base module is coupled to directly communicate with the VMEbus network.

21. A stacking module, comprising:

a second portion of a stacking switched fabric connector coupled to interface with a first portion of the stacking switched fabric connector on a base module, wherein the stacking module is communicatively coupled to a switched fabric via the base module and the first portion of the stacking switched fabric connector, wherein the stacking module and the base module have a 3U form factor, and wherein switched fabric operates concurrently on a backplane with a VMEbus network; and switched fabric data unit coupled to the second portion of the stacking switched fabric connector, wherein the switched fabric data unit is coupled to communicate with switched fabric.

22. The stacking module of claim 21, wherein the stacking module is coupled to directly communicate with the switched fabric via the backplane.

23. The stacking module of claim 21, wherein the stacking module is coupled to communicate with the VMEbus network through the stacking switched fabric connector.

24. The stacking module of claim 21, wherein the stacking module is coupled to communicate directly with the VMEbus network.

25. The stacking module of claim 21, wherein the base module and the stacking module are coupled to communicate with each other independent of the backplane.

\* \* \* \* \*